United States Patent
Lu et al.

(10) Patent No.: US 8,384,418 B1
(45) Date of Patent: Feb. 26, 2013

(54) MITIGATING THE EFFECT OF SINGLE EVENT TRANSIENTS ON INPUT/OUTPUT PINS OF AN INTEGRATED CIRCUIT DEVICE

(75) Inventors: Weiguang Lu, San Jose, CA (US); Matthew P. Baker, San Francisco, CA (US)

(73) Assignee: Xilinx, Inc., San Jose, CA (US)

( * ) Notice: Subject to any disclaimer, the term of this patent is extended or adjusted under 35 U.S.C. 154(b) by 27 days.

(21) Appl. No.: 13/071,453

(22) Filed: Mar. 24, 2011

Related U.S. Application Data

(62) Division of application No. 12/555,733, filed on Sep. 8, 2009, now abandoned.

(51) Int. Cl.
*H03K 19/003* (2006.01)
*H03K 19/007* (2006.01)

(52) U.S. Cl. ................ 326/11; 326/14; 326/96
(58) Field of Classification Search ............ 326/11–14, 326/93–98
See application file for complete search history.

(56) References Cited

U.S. PATENT DOCUMENTS

| | | |
|---|---|---|
| 6,504,410 B2 | 1/2003 | Waldie et al. |
| 6,637,005 B1 | 10/2003 | Kohnen |
| 7,539,931 B2 * | 5/2009 | Thayer .................. 714/797 |
| 7,772,874 B2 * | 8/2010 | Rezgui et al. .................. 326/21 |
| 8,191,021 B2 * | 5/2012 | Rezgui .................. 716/106 |
| 2010/0026338 A1 * | 2/2010 | Fulcomer .................. 326/11 |

OTHER PUBLICATIONS

U.S. Appl. No. 12/555,733, filed Sep. 8, 2009, Lu, Weiguang, XILINX, Inc., 2100 Logic Drive, San Jose, CA USA.

\* cited by examiner

*Primary Examiner* — James H Cho
(74) *Attorney, Agent, or Firm* — Kevin T. Cuenot

(57) ABSTRACT

A system for protecting an input/output (I/O) pin of an integrated circuit device (IC) from single event transients is disclosed. The system includes a first delay circuit that is configured to delay a clock signal from the clock source by a first predetermined amount of time, and a second delay circuit that is configured to delay the clock signal by a second predetermined amount of time. The system further includes a first register that is clocked by the clock signal, a second register that is clocked by the clock signal delayed by the first predetermined amount of time, and a third register that is clocked by the clock signal delayed by the second predetermined amount of time. The system also includes voter circuits, where each voter circuit is configured to receive a first data signal from an output of the first register, a second data signal from an output of the second register, and a third data signal from an output of the third register.

9 Claims, 3 Drawing Sheets

MITIGATING THE EFFECT OF SINGLE EVENT TRANSIENTS ON INPUT/OUTPUT PINS OF AN INTEGRATED CIRCUIT DEVICE

CROSS-REFERENCE TO RELATED APPLICATIONS

This application is a divisional of U.S. patent application having the application Ser. No. 12/555,733 filed on Sep. 8, 2009 and titled "MITIGATING THE EFFECT OF SINGLE EVENT TRANSIENTS ON INPUT/OUTPUT PINS OF AN INTEGRATED CIRCUIT DEVICE" by Weiguang Lu and Matthew P. Baker, now abandoned.

GOVERNMENT CONTRACT

The U.S. Government may have certain rights to this invention as provided for by the terms of AFRL Contract # FA9453-07-C-0178.

FIELD OF THE INVENTION

An embodiment disclosed within this specification relates to integrated circuit devices (ICs). More particularly, an embodiment relates to mitigating the effect of single event transients on input/output pins of an IC.

BACKGROUND

Within a digital and/or an analog system, a single event can cause one or more voltage pulses to propagate through the system. The phrase "single event" typically refers to a collision of an energetic particle, a cosmic ray, e.g., a proton, or the like, with an integrated circuit device (IC) of the system. A pulse generated in consequence of the single event is referred to as a "single event transient" or "SET."

While propagation of an SET through a system is not desirable, an SET is not a change in state of some part of the system, as is a "single event upset" or "SEU." In this respect, an SET can be distinguished from an SEU. An SEU generally refers to a change of state of a memory cell, e.g., a change from zero to one or a change from one to zero, caused by an SET. SEUs can manifest themselves within digital, analog, and optical components of a system or may have effects in surrounding interface circuitry. Thus, when an SET results in an incorrect value being latched into a sequential logic unit, for example, the SET is considered an SEU.

SEUs are generally referred to as "soft" errors in that a reset or rewriting of the IC typically causes normal device behavior after the occurrence of the SEU. In general, any "soft" malfunction of a bit that causes infrequent errors relative to the rate at which such errors are fixed by mitigation techniques and which has a relatively low correlation between errors can be considered an SEU.

One way of mitigating the effects of SETs is through the application of a technique called Triple Module Redundancy (TMR). TMR refers to the triplication of particular portions of a circuit design. For example, selected modules and data signals can be triplicated. At various points within the circuit, voter circuits can be inserted to determine which of the triplicated data signals is the correct or accurate data signal.

While TMR works well with respect to the internal circuitry of an IC, TMR can be impractical to implement for input/output (I/O) pins of an IC. Some ICs, for example, have thousands of I/O pins, making triplication very costly. TMR, as applied to I/O pins, also adds to the complexity of the IC. Further, not all devices that are to be coupled to an IC that utilizes TMR provide triplicated I/O pins. Triplicated I/O pins also add to the size, complexity, and therefore, cost of the printed circuit (PC) board upon which an IC with triplicated I/O pins is disposed.

SUMMARY

One or more embodiments disclosed within this specification relate to integrated circuit devices (ICs) and, more particularly, to mitigating the effect of single event transients (SETs) on input/output (I/O) pins of an IC. One embodiment of the present invention includes a system for protecting an I/O pin of an IC. The system includes a first register comprising an input coupled to the I/O pin of the IC, a first delay circuit comprising an input coupled to the I/O pin, wherein the first delay circuit is configured to delay data signals by a first predetermined amount of time, and a second register comprising an input coupled to an output of the first delay circuit. The system also includes a second delay circuit comprising an input coupled to the I/O pin, wherein the second delay circuit is configured to delay data signals by a second predetermined amount of time. A third register comprising an input coupled to an output of the second delay circuit is included. The system further includes a plurality of voter circuits. Each voter circuit is configured to receive a data signal from an output of the first register, an output of the second register, and an output of the third register.

The first register, the second register, and the third register each can be clocked by a same clock signal. In one aspect, the second predetermined amount of time can be greater than the first predetermined amount of time. For example, the second predetermined amount of time can be approximately twice as long as the first predetermined amount of time. In a further example, the first predetermined amount of time can be at least as long as a width of a pulse caused by a single event transient.

In another aspect, the system can include a third delay circuit. The third delay circuit can be disposed between the I/O pin and the first register. The third delay circuit can be configured to delay data signals by a third predetermined amount of time.

Each voter circuit can generate an output data signal that is substantially equivalent to a majority of the first data signal, the second data signal, and the third data signal. In one aspect, the plurality of voter circuits can include three voter circuits.

Another embodiment of the present invention includes a system for protecting an I/O pin of an IC. The system includes a first delay circuit comprising an input coupled to a clock source of the IC, wherein the first delay circuit is configured to delay a clock signal from the clock source by a first predetermined amount of time, and a second delay circuit comprising an input coupled to the clock source, wherein the second delay circuit is configured to delay the clock signal by a second predetermined amount of time. The system also includes a first register comprising an input coupled to the I/O pin, wherein the first register is clocked by the clock signal, a second register comprising an input coupled to the I/O pin, wherein the second register is clocked by the clock signal delayed by the first predetermined amount of time, and a third register comprising an input coupled to the I/O pin, wherein the third register is clocked by the clock signal delayed by the second predetermined amount of time. Further, the system can include a first plurality of voter circuits, wherein each voter circuit is configured to receive a first data signal from an output of the first register, a second data signal from an output of the second register, and a third data signal from an output of the third register.

Each voter circuit of the first plurality of voter circuits can generate an output data signal that is substantially equivalent to a majority of the first data signal, the second data signal, and the third data signal. In one aspect, the first plurality of voter circuits can comprise a first voter circuit, a second voter circuit, and a third voter circuit. In another aspect, the first register, the second register, and the third register each can be clocked by a falling edge of the clock signal.

The system also can include a fourth register coupled to an output of the first voter circuit, a fifth register coupled to an output of the second voter circuit, and a sixth register coupled to an output of the third voter circuit. The fourth register, the fifth register, and the sixth register each can be clocked by a rising edge of the clock signal, wherein the clock signal provided to each of the fourth, fifth, and sixth registers is time aligned.

The system further can include a second plurality of voter circuits, wherein each voter circuit of the second plurality of voter circuits receives a fourth data signal from an output of the fourth register, a fifth data signal from an output of the fifth register, and a sixth data signal from an output of the sixth register. Each voter circuit of the second plurality of voter circuits also can generate an output data signal that is substantially equivalent to a majority of the fourth data signal, the fifth data signal, and the sixth data signal.

Another embodiment of the present invention includes a system for protecting an I/O pin of an IC. The system includes a plurality of filters, wherein each filter comprises an input coupled to the I/O pin of the IC and a plurality of registers, wherein each register comprises an input coupled to an output of one of the plurality of filters. The system also includes a plurality of voter circuits. Each voter circuit is configured to receive a data signal from an output of each of the plurality of registers. Each voter circuit generates an output data signal that is substantially equivalent to a majority of the data signals received from each of the plurality of registers.

In one aspect, the plurality of filters can comprise three filters. The plurality of registers can comprise three registers. The plurality of voter circuits can comprise three voter circuits. In another aspect, each register can be clocked by a same, time-aligned clock signal.

In a further aspect, each of the plurality of filters can be a glitch filter. In still another aspect, each filter can be configured to absorb a pulse caused by a single event transient.

The system can be located on the IC with a minimum, predetermined distance separating the system from another system for protecting another I/O pin of the IC, within a different clock domain, from single event transients.

DETAILED DESCRIPTION OF THE DRAWINGS

Figure 1:
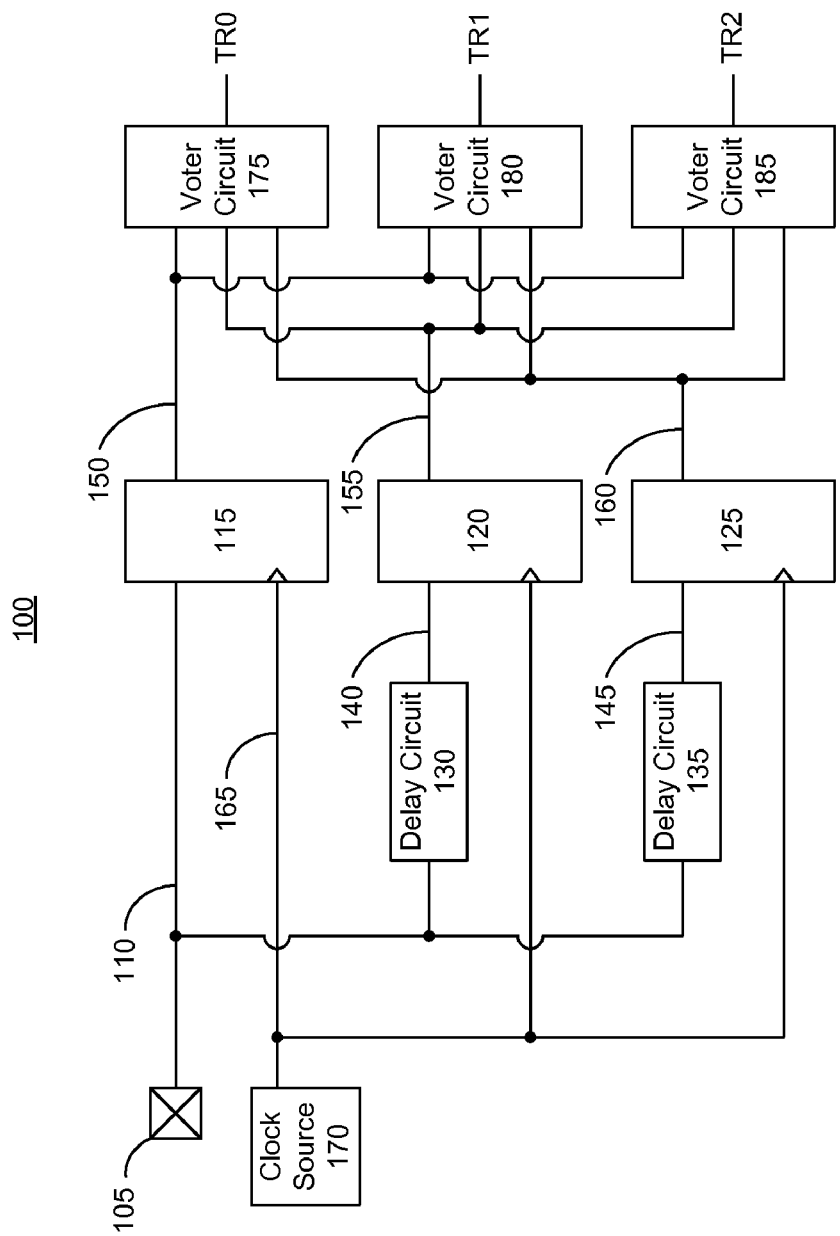
FIG. 1 is a first block diagram illustrating a system for mitigating the effect of single event transients (SETs) on an input/output (I/O) pin of an integrated circuit device (IC) in accordance with one embodiment of the present invention.

While the specification concludes with claims defining the features of the invention that are regarded as novel, it is believed that one or more embodiments of the invention will be better understood from a consideration of the description in conjunction with the drawings. Detailed embodiments of the present invention are disclosed herein; however, it is to be understood that the disclosed embodiments are merely exemplary. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of one or more embodiments of the invention.

One or more embodiments disclosed within this specification relate to integrated circuit devices (ICs) and, more particularly, to mitigating the effect of single event transients (SETs) on input/output (I/O) pins of an IC. The one or more embodiments disclosed herein provide SET protection systems that mitigate the effect of SETs upon I/O pins without applying redundancy, whether duplication, triple module redundancy (TMR), e.g., triplicating, or the like, to each I/O pin for which protection from SETs is desired. The one or more embodiments can output a triplicated signal that can be provided to the internal circuitry of the IC within which the SET protection system(s) disclosed herein are implemented.

In accordance with the inventive arrangements disclosed herein, different signal processing techniques can be applied to I/O pins to overcome and/or mitigate the effect of SETs on I/O pins of an IC. In one aspect, the data signals received at an I/O pin can be processed by applying selective delay or filtering to mitigate the effect of SETs. In another aspect, the clock signal provided to the SET protection system(s) can be selectively delayed to mitigate the effect of SETs.

One or more embodiments described within this specification can be utilized within any of a variety of different ICs. In one embodiment, the SET protection systems described can be applied to I/O pins of a programmable IC. Programmable ICs are a well-known type of IC that can be programmed to perform specified logic functions. Examples of programmable ICs can include field programmable gate arrays (FPGAs) and complex programmable logic devices (CPLDs). The functionality of a programmable IC is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable IC are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

FIG. 1 is a first block diagram illustrating a system 100 for mitigating effect of SETs on an input/output (I/O) pin of an IC in accordance with one embodiment of the present invention. In general, system 100 distributes a signal 110 from an I/O pin, such as I/O pin 105, to each of a plurality of different registers 115, 120, and 125. I/O pin 105 can be a pin of an IC within which system 100 is disposed. I/O pin 105 is coupled to circuitry that is external to the IC. As pictured in FIG. 1, I/O pin 105 is coupled to an input of register 115. Accordingly, register 115 receives data signal 110. Data signal 110 is received, via I/O pin 105, from a source that is external to the IC within which system 100 is disposed.

Within this specification, the same reference characters are used to refer to terminals, signal lines, wires, and their corresponding signals. In this regard, the terms "signal," "wire," "connection," "terminal," and "pin" may be used interchangeably, from time-to-time, within the specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

System 100 further includes a plurality of delay circuits 130 and 135. An input of delay circuit 130 is coupled to I/O pin 105 and, therefore, receives data signal 110. Delay circuit 130 can be configured to delay a received data signal, e.g., data signal 110, by a first predetermined amount of time. Accordingly, delayed data signal 140, which can be propagated from an output of delay circuit 130, is the same as, or is substantially similar to, data signal 110, albeit delayed by the first predetermined amount of time.

An input of delay circuit 135 is coupled to I/O pin 105 and, therefore, receives data signal 110. Delay circuit 135 can be configured to delay a received data signal, such as data signal 110, by a second predetermined amount of time. Accordingly, delayed data signal 145, propagated from an output of delay circuit 135, is the same as, or is substantially similar to, data signal 110, albeit delayed by the second predetermined amount of time.

As noted, register 115 receives data signal 110 from I/O pin 105. An input of register 120 is coupled to an output of delay circuit 130. Accordingly, register 120 receives delayed data signal 140, which is delayed, in comparison to data signal 110, by the first predetermined amount of time. Similarly, an input of register 125 is coupled to an output of delay circuit 135. As such, register 125 receives delayed data signal 145, which is delayed, in comparison to data signal 110, by the second predetermined amount of time.

Each of registers 115, 120, and 125 can be implemented as a component comprising some form of memory. For example, each of registers 115, 120, and 125 can be implemented in the form of a flip-flop. It should be appreciated that a variety of different components such as flip-flops, latches, or the like can be used. Accordingly, one or more embodiments disclosed within this specification are not intended to be limited by the type of register that is used. Though not shown for purposes of clarity in FIG. 1, it should be appreciated that each of registers 115, 120, and 125 will include a reset port that receives a reset signal.

Continuing with FIG. 1, a clock signal 165 is propagated from a clock source 170. As shown, each of registers 115, 120, and 125 receives clock signal 165. In one embodiment, each of registers 115, 120, and 125 can be clocked on the rising edge of clock signal 165. In another embodiment, each of registers 115, 120, and 125 can be clocked on a falling edge of clock signal 165. In any case, as shown, register 115 can include an output that generates data signal 150. Register 120 can include an output that generates data signal 155. Register 125 can include an output that generates data signal 160.

System 100 further can include a plurality of voter circuits 175, 180, and 185. As shown, each of voter circuits 175, 180, and 185 includes a plurality of inputs, e.g., three inputs, that receive data signals 150, 155, and 160. Each of voter circuits 175, 180, and 185 can be configured to select the majority data signal from data signals 150, 155, and 160, and output a data signal that is substantially similar to, if not the same as, the majority data signal. Voter circuit 175 includes an output that generates data signal TR0; voter circuit 180 includes an output that generates data signal TR1; and voter circuit 185 includes an output that generates data signal TR2. The notation "TR," as used herein, refers to triplicated, in that the data signal initially received, e.g., data signal 110, is now triplicated for processing within an IC that implements TMR. For purpose of illustration, if data signals 150 and 155 are high and data signal 160 is low, each of voter circuits 175, 180, and 185 will output a high data signal. TR0, TR1, and TR2 will be high data signals.

In general, the amount of delay applied by each of delay circuits 130 and 135 can be correlated with the amount of time that a glitch caused by an SET takes to propagate through a particular point within a circuit. For example, a glitch can be modeled or represented within system 100 as a pulse. If the pulse is presumed to be less than approximately 400 picoseconds, the delay applied by delay circuit 130, i.e., the first predetermined amount of time, can be approximately 400 picoseconds. The delay applied by delay circuit 135, i.e., the second predetermined amount of time, can be approximately twice the delay applied by delay circuit 130. Accordingly, the second predetermined amount of time can be approximately 800 picoseconds.

The term "approximately," as used within this specification, can mean that a value is within some specified, e.g., predetermined, or allowable tolerance of a stated value. Referring to the example times noted previously, "approximately 400 picoseconds" can be exactly 400 picoseconds, within some given tolerance above 400 picoseconds, or within some given tolerance below 400 picoseconds.

It should be appreciated that the amount of delay applied can vary according to the width of the pulse caused by an SET. The first predetermined amount of time can be larger than the expected width of the pulse caused by an SET. While the range of delay can be decreased, and is limited in terms of a lower bound by the expected pulse width, the upper bound of the first predetermined amount of time is limited by the setup time of the circuit, e.g., system 100. More particularly, the first predetermined amount of time, which is roughly one-half the second predetermined amount of time, should not be so large that the second predetermined amount of time violates setup requirements of system 100.

In one embodiment, the delay applied by each of delay circuits 130 and 135 can be a tunable amount of time. For example, the amount of delay applied by each of delay circuits 130 and 135 can be independently tuned or set through programming or setting particular circuit attributes that can be loaded into an IC comprising system 100. When loaded, the attributes set the desired delays into each of delay circuit 130 and delay circuit 135.

In operation, when the width of the pulse generated by an SET that is propagated on data signal 110 is less than the first predetermined amount of time, registers 115, 120, and 125 do not receive the pulse at the same time. Register 115, for example, receives the pulse at time 0. Register 120 receives the pulse at time (0+the first predetermined amount of time). Register 125 receives the pulse at time (0+the second predetermined amount of time).

By varying the time when each of registers 115, 120, and 125 receives the pulse, presuming the first predetermined amount of time exceeds the width of the pulse and the roughly two to one relationship between the second and first predetermined amounts of time, only one of registers 115, 120, and 125 latches a potentially incorrect value. The two registers that do not receive the pulse latch a correct value. Signals 150, 155, and 160, being output from registers 115, 120, and 125 respectively, are time aligned as each of registers 115, 120, and 125 is clocked by clock signal 165. The delays introduced are effectively removed. Voter circuits 175, 180, and 185 vote down the potentially incorrect value and output the correct value as TR0, TR1, and TR2.

In another embodiment, an optional, additional delay circuit (not shown) can be disposed between I/O pin 105 and register 115. In that case, the additional delay circuit can include an input coupled to I/O pin 105 that receives signal 110. The additional delay circuit can be configured to delay data signal 110 by a predetermined amount of time. The delayed data signal can be propagated from an output of the additional delay circuit. The amount of delay applied by the third delay circuit, for example, can be approximately three times the delay provided by delay circuit 130. It should be appreciated that whether system 100 includes two or three delay circuits, the time difference in the delay provided by each respective delay circuit should be longer than the width of any pulse generated or caused by an SET to prevent such a pulse from reaching two or more of registers 115, 120, and 125 at the same time, thereby causing those registers to latch an incorrect value that the voter circuits 175, 180, and 185 will propagate.

Figure 2:
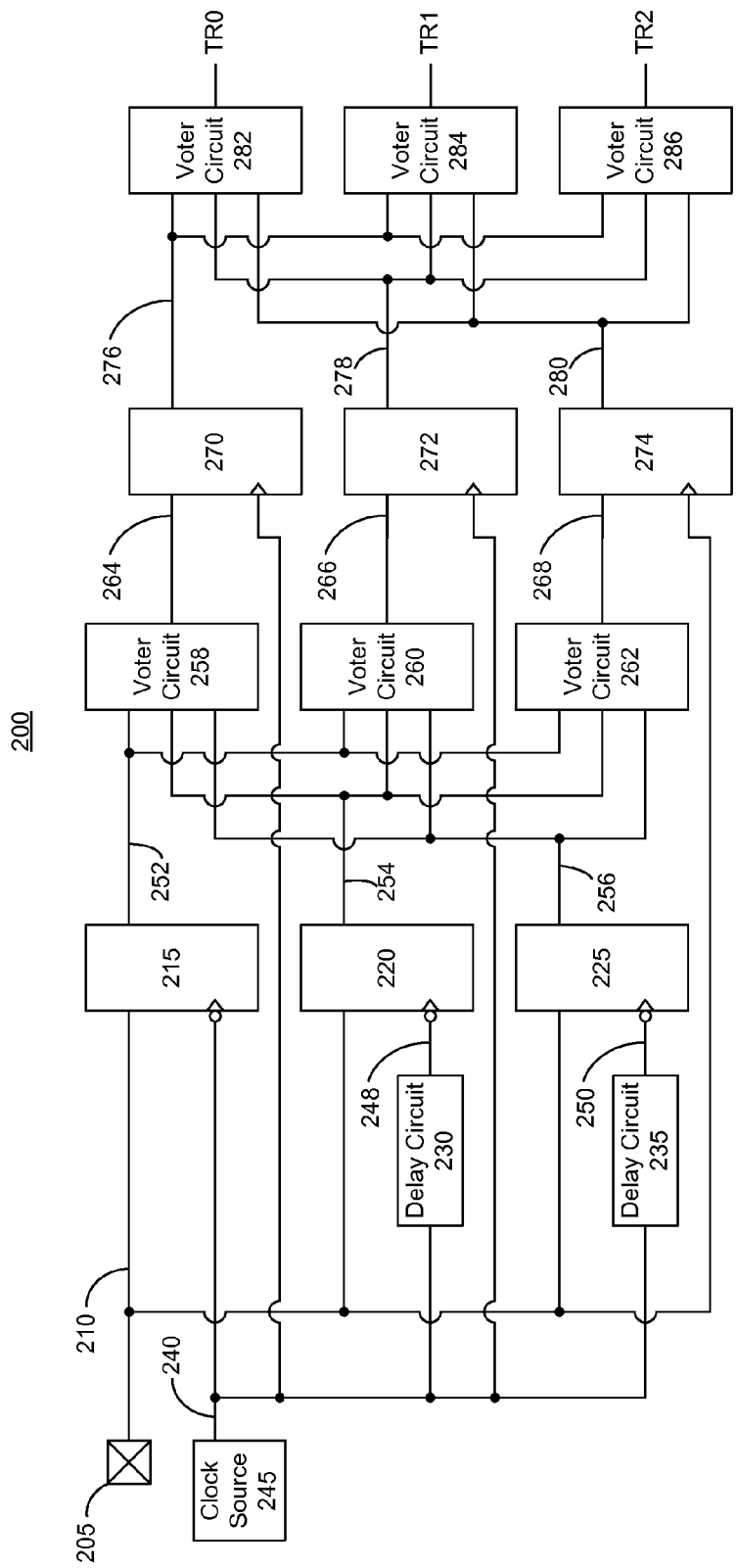
FIG. 2 is a second block diagram illustrating a system for mitigating the effect of SETs on an I/O pin of an IC in accordance with another embodiment of the present invention.

FIG. 2 is a second block diagram illustrating a system 200 for mitigating effect of SETs on an I/O pin of an IC in accordance with another embodiment of the present invention. Whereas the system described with reference to FIG. 1 delayed data signals, e.g., the data signal from the I/O pin, system 200 operates to delay clock signals applied to the different registers.

Thus, as shown, data signal 210, from I/O pin 205, is distributed to a first stage of registers comprising registers 215, 220, and 225. Each of registers 215, 220, and 225 includes an input that receives data signal 210. Delay circuits 230 and 235 are used to process, e.g., delay, clock signal 240 from clock source 245. As shown, clock signal 240 is provided to register 215 without being processed by any delay.

Delay circuit 230 includes an input that is coupled to clock source 245. As such, delay circuit 230 receives clock signal 240. Delay circuit 230 is configured to delay clock signals by a first predetermined amount of time. Accordingly, delay circuit 230 generates delayed clock signal 248, which is the same as, or substantially the same as, clock signal 240, albeit delayed by the first predetermined amount of time. Register 220 is clocked by delayed clock signal 248.

Delay circuit 235 includes an input that is coupled to clock source 245. Accordingly, delay circuit 235 receives clock signal 240. Delay circuit 235 is configured to delay clock signals by a second predetermined amount of time. The first and second predetermined amounts of time can be similar to, or the same as, those described with reference to FIG. 1. Accordingly, delay circuit 235 generates delayed clock signal 250, which is the same as, or substantially the same as, clock signal 240, albeit delayed by the second predetermined amount of time. Register 225 is clocked by delayed clock signal 250.

In one embodiment, each of registers 215, 220, and 225 has an inverted clock input. In this regard, each of registers 215, 220, and 225 can be clocked by the falling edge of the clock signal received by that register. Register 215 is clocked by the falling edge of clock signal 240. Register 220 is clocked by the falling edge of delayed clock signal 248. Register 225 is clocked by the falling edge of delayed clock signal 250.

Register 215 can include an output that generates data signal 252. Register 220 can include an output that generates data signal 254. Register 225 can include an output that generates data signal 256.

System 200 can include a first stage of voter circuits comprising voter circuits 258, 260, and 262. As shown, each of voter circuits 258, 260, and 262 includes a plurality of inputs, e.g., three inputs, that receive data signals 252, 254, and 256. Each of voter circuits 258, 260, and 262 can be configured to select the majority data signal from data signals 252, 254, and 256, and output a data signal that is substantially similar to, if not the same as, the majority signal as described with reference to FIG. 1. In this regard, voter circuit 258 includes an output that generates data signal 264; voter circuit 260 includes an output that generates data signal 266; and voter circuit 262 includes an output that generates data signal 268.

System 200 can include a second stage of registers comprising registers 270, 272, and 274. Register 270 includes an input that is coupled to the output of voter circuit 258. As such, register 270 receives data signal 264. Register 272 includes an input that is coupled to the output of voter circuit 260. Register 272 receives data signal 266. Register 274 includes an input that is coupled to the output of voter circuit 262. Accordingly, register 274 receives data signal 268.

Each of registers 270, 272, and 274 of the second stage of registers is clocked by clock signal 240, which is the non-delayed clock signal from clock source 245. Further, the clock port of each of registers 270, 272, and 274 is not inverted as is the clock port of each of registers 215, 220, and 225 of the first stage of registers. Accordingly, registers 270, 272, and 274 are clocked on the rising edge of clock signal 240.

The second stage of registers allows system 200 to be incorporated into an IC that, for example, includes internal circuitry that is triplicated and clocked on the rising edge of a clock signal. In this regard, the second stage of registers, as well as the second stage of voter circuits to be described herein, can be considered an interface to the remainder, or internal circuitry, of the IC within which system 200 is disposed.

Continuing with FIG. 2, system 200 can include a second stage of voter circuits comprising voter circuits 282, 284, and 286. As shown, each of voter circuits 282, 284, and 286 includes a plurality of inputs, e.g., three inputs, that receive data signals 276, 278, and 280. Each of voter circuits 282, 284, and 286 can be configured to select the majority data signal from data signals 276, 278, and 280, and output a data signal that is substantially similar to, if not the same as, the majority signal. Thus, voter circuit 282 includes an output that generates data signal TR0; voter circuit 284 includes an output that generates data signal TR1; and voter circuit 286 includes an output that generates data signal TR2.

System 200 operates in similar fashion to system 100 of FIG. 1. Rather than delaying data signals, however, clock signals are delayed. Delaying clock signals in the manner shown in FIG. 2 results in each of registers 215, 220, and 225 latching data signal 210 at a different time. Register 215 latches data signal 210 at time 0. Register 220 latches data signal 210 at time: 0+the first predetermined amount of time. Register 225 latches data signal 210 at time: 0+the second predetermined amount of time. When the first predetermined amount of time exceeds the width of a pulse generated in consequence of an SET and the second predetermined amount of time is approximately twice the first predetermined amount of time, at most one of registers 215, 220, and 225 latches an incorrect value caused by the pulse. The remaining two registers latch a correct value that is not influenced by the pulse. Voter circuits 258, 260, and 262 output the majority data signal, e.g., the correct data signal latched by two of registers 215, 220, and 225.

In one embodiment, system 200 can be limited to the first stage of registers and the first stage of voter circuits. The second stage of registers and the second stage of voter circuits can be considered an interface that begins operating, e.g., clocking, on the rising edge of clock signal 240. Like system 100 illustrated in FIG. 1, reset ports and reset signals for registers 215, 220, 225, 270, 272, and 274 are not shown.

Figure 3:
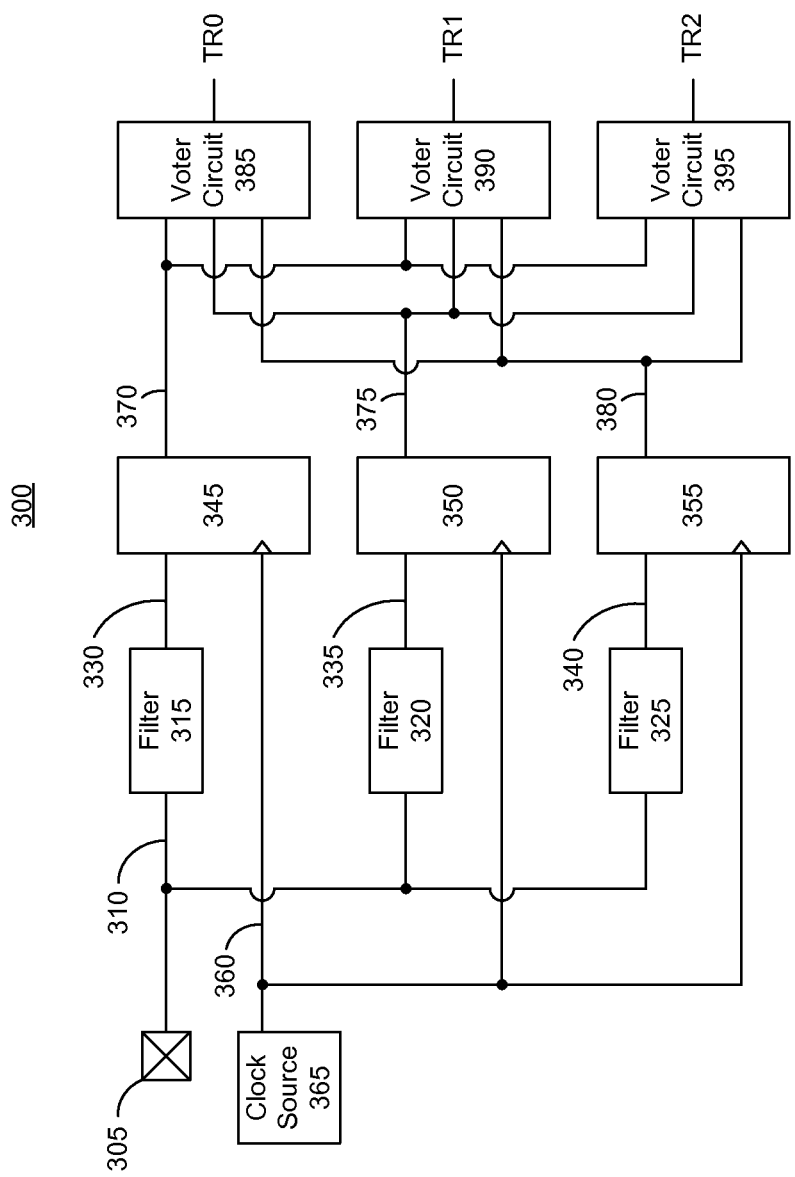
FIG. 3 is a third block diagram illustrating a system for mitigating the effect of SETs on an I/O pin of an IC in accordance with another embodiment of the present invention.

FIG. 3 is a third block diagram illustrating a system 300 for mitigating the effect of SETs on an I/O pin of an IC in accordance with another embodiment of the present invention. System 300 distributes a data signal 310 from an I/O pin 305 to a plurality of filters 315, 320, and 325, each being configured to remove or reduce the effect of SETs. Each of filters 315, 320, and 325 can include an input that is coupled to I/O pin 305, thereby allowing each respective one of filters 315, 320, and 325 to receive data signal 310. Each of filters 315, 320, and 325 can be configured as a glitch filter that can remove or reduce the effect of SETs.

In general, a "glitch filter" refers to a circuit used to remove an unwanted transient voltage or pulse from a signal. In a simple synchronous system, for example, any pulse shorter than a clock cycle can be considered a glitch unless the system is configured to expect a short pulse, whether on a clock signal or an input signal. It should be appreciated that any of a variety of different low pass filters can be used as a glitch filter. For example, a passive resistor-capacitor network with one side of capacitor coupled to ground.

Each of filters 315, 320, and 325 can be implemented as an analog filter or a digital filter. In one embodiment, each of filters 315, 320, and 325 can be configured to attenuate or remove a pulse having a width of approximately 400 picoseconds.

Each of filters 315, 320, and 325 can include an output that generates a filtered version of data signal 310, denoted as data signals 330, 335, and 340, to registers 345, 350, and 355 respectively. As pictured, each of registers 345, 350, and 355 is clocked by clock signal 360 from clock source 365. In one embodiment, each of registers 345, 350, and 355 can be clocked on the rising edge of clock signal 360. In another embodiment, each of registers 345, 350, and 355 can be clocked on a falling edge of clock signal 360. Register 345 can include an output that generates data signal 370. Register 350 can include an output that generates data signal 375. Register 355 can include an output that generates data signal 380. Reset ports and reset signals for each of registers 345, 350, and 355 are not illustrated in FIG. 3 for purposes of clarity.

System 300 further can include a plurality of voter circuits 385, 390, and 395. As shown, each of voter circuits 385, 390, and 395 includes a plurality of inputs, e.g., three inputs, that receive data signals 370, 375, and 380. Each of voter circuits 385, 390, and 395 can be configured to select the majority data signal from data signals 370, 375, and 380, and output a data signal that is substantially similar to, if not the same as, the majority signal. Voter circuit 385 includes an output that generates data signal TR0; voter circuit 390 includes an output that generates data signal TR1; and voter circuit 395 includes an output that generates data signal TR2.

In operation, a pulse on data signal 310 can be mitigated, e.g., attenuated or removed, from data signal 310 by each of filters 315, 320, and 325. Accordingly, the values latched by each of registers 345, 350, and 355 from data signals 330, 335, and 340 respectively, will be correct values that are not corrupted by any pulses generated by SETs.

One or more embodiments described within this specification provide systems for reducing the effect of SETs upon an I/O pin of an IC. The one or more embodiments disclosed can be applied to any I/O pin of an IC, including I/O pins that typically are used, or reserved, for loading configuration data into the IC. For example, in the case of a programmable IC, one or more embodiments described within this specification can be used to protect I/O pins that receive or are involved in programming, e.g., loading, the IC with a given circuit design as specified by configuration data such as a bitstream, for example. Thus, pins that receive configuration data as well as pins that are used in reading back configuration data that has been loaded into the IC can be protected using one or more embodiments described herein.

One or more embodiments further can be utilized on an interface between two blocks or circuits within a single IC. For example, one or more embodiments can be utilized within a system-on-a-chip between a first sub-block having some form of redundancy and a second sub-block to which the first sub-block is coupled does not have redundancy.

When applying one or more embodiments described within this specification to different I/O pins, spacing requirements can be utilized to increase the resilience of I/O pins to the effect of SETs. In one aspect, two adjacent SET protection systems, as described within this specification, when implemented for I/O pins corresponding to, or belonging to, different clock domains, can be separated by a minimum, predetermined distance. Thus, two adjacent SET protection systems driven by clock signals from different clock sources, e.g., having different frequencies, can be separated by the minimum, predetermined distance. In one embodiment, the minimum, predetermined distance can be approximately 4 um, though this can be smaller or larger. This does not preclude separating adjacent SET protection systems used on I/O pins within a same or single clock domain, however, as such configurations also can benefit from utilizing some minimum spacing between adjacent SET protection systems.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open-ended language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The embodiments disclosed herein can be embodied in other forms without departing from the spirit or essential attributes thereof. Accordingly, reference should be made to the following claims, rather than to the foregoing specification, as indicating the scope of the embodiments of the present invention.

What is claimed is:

1. A system for protecting an input/output (I/O) pin of an integrated circuit device (IC) from single event transients, the system comprising:
   a first delay circuit comprising an input coupled to a clock source of the IC, wherein the first delay circuit is configured to delay a clock signal from the clock source by a first predetermined amount of time;
   a second delay circuit comprising an input coupled to the clock source, wherein the second delay circuit is configured to delay the clock signal by a second predetermined amount of time;
   a first register comprising an input coupled to the I/O pin, wherein the first register is clocked by the clock signal;
   a second register comprising an input coupled to the I/O pin, wherein the second register is clocked by the clock signal delayed by the first predetermined amount of time;

a third register comprising an input coupled to the I/O pin, wherein the third register is clocked by the clock signal delayed by the second predetermined amount of time; and a first plurality of voter circuits, wherein each voter circuit is configured to receive a first data signal from an output of the first register, a second data signal from an output of the second register, and a third data signal from an output of the third register, wherein the first plurality of voter circuits comprises a first voter circuit, a second voter circuit, and a third voter circuit, wherein the system further comprises:

a fourth register coupled to an output of the first voter circuit;

a fifth register coupled to an output of the second voter circuit; and a sixth register coupled to an output of the third voter circuit, wherein the fourth register, the fifth register, and the sixth register each is clocked by a rising edge of the clock signal, wherein the clock signal provided to each of the fourth, fifth, and sixth registers is time aligned.

2. The system of claim 1, wherein each voter circuit of the first plurality of voter circuits generates an output data signal that is substantially equivalent to a majority of the first data signal, the second data signal, and the third data signal.

3. The system of claim 1, wherein the first register, the second register, and the third register each is clocked by a falling edge of the clock signal.

4. The system of claim 1, further comprising:

a second plurality of voter circuits, wherein each voter circuit of the second plurality of voter circuits receives a fourth data signal from an output of the fourth register, a fifth data signal from an output of the fifth register, and a sixth data signal from an output of the sixth register, wherein each voter circuit of the second plurality of voter circuits generates an output data signal that is substantially equivalent to a majority of the fourth data signal, the fifth data signal, and the sixth data signal.

5. A system for protecting an integrated circuit device (IC) from a single event transient (SET), the system comprising:

a first register configured to process a data signal;

a second register configured to process a first copy of the data signal;

a third register configured to process a second copy of the data signal;

a first circuit coupled to the second register, wherein the first circuit is configured to apply an SET mitigation technique;

a second circuit coupled to the third register, wherein the second circuit is configured to apply the SET mitigation technique; and at least one voter circuit configured to receive a data signal from an output of the first register, the second register, and the third register, wherein the SET mitigation technique comprises one of delaying a clock signal provided to the second register and the third register;

wherein the at least one voter circuit comprises a first voter circuit, a second voter circuit, and a third voter circuit forming a first plurality of voter circuits, wherein the system further comprises:

a fourth register coupled to an output of the first voter circuit;

a fifth register coupled to an output of the second voter circuit; and a sixth register coupled to an output of the third voter circuit, wherein the fourth register, the fifth register, and the sixth register are clocked by a clock signal that is time aligned.

6. The system of claim 5, further comprising:

a second plurality of voter circuits, wherein each voter circuit of the second plurality of voter circuits receives a data signal from an output of the fourth register, a data signal from an output of the fifth register, and a data signal from an output of the sixth register, wherein each voter circuit of the second plurality of voter circuits generates an output data signal that is substantially equivalent to a majority of the fourth data signal, the fifth data signal, and the sixth data signal.

7. A method for protecting an input/output (I/O) pin of an integrated circuit device (IC), comprising:

delaying a clock signal from the clock source by a first predetermined amount of time to generate a first delayed clock signal;

delaying the clock signal by a second predetermined amount of time to generate a second delayed clock signal;

storing, using a first register, an input, wherein the first register is clocked by the clock signal;

storing, using a second register, the input, wherein the second register is clocked by the first delayed clock signal;

storing, using a third register, the input, wherein the third register is clocked by the second delayed clock signal;

selecting, using a first voter circuit, a first majority data signal from an output of the first register, an output of the second register, and an output of the third register;

selecting, using a second voter circuit, a second majority data signal from the output of the first register, the output of the second register, and the output of the third register;

selecting, using a third voter circuit, a third majority data signal from the output of the first register, the output of the second register, and the output of the third register;

storing, using a fourth register, an output of the first voter circuit, wherein the fourth register is clocked by a rising edge of the clock signal;

storing, using a fifth register, an output of the second voter circuit, wherein the fifth register is clocked by the rising edge of the clock signal; and storing, using a sixth register, an output of the third voter circuit, wherein the sixth register is clocked by the rising edge of the clock signal, wherein the clock signal provided to each of the fourth, fifth, and sixth registers is time aligned.

8. The method of claim 7, wherein the first register, the second register, and the third register each is clocked by a falling edge of the clock signal.

9. The method of claim 7, further comprising:

selecting, using a fourth voter circuit, a fourth majority data signal from an output of the fourth register, an output of the fifth register, and an output of the sixth register;

selecting, using a fifth voter circuit, a fifth majority data signal from the output of the fourth register, the output of the fifth register, and the output of the sixth register; and selecting, using a sixth voter circuit, a sixth majority data signal from the output of the fourth register, the output of the fifth register, and the output of the sixth register.

* * * * *

UNITED STATES PATENT AND TRADEMARK OFFICE
CERTIFICATE OF CORRECTION

| | |
|---|---|
| PATENT NO. | : 8,384,418 B1 |
| APPLICATION NO. | : 13/071453 |
| DATED | : February 26, 2013 |
| INVENTOR(S) | : Lu et al. |

It is certified that error appears in the above-identified patent and that said Letters Patent is hereby corrected as shown below:

In the Specification

Column 1, lines 17-19, replace "The U.S. Government may have certain rights to this invention as provided for by the terms of AFRL Contract # FA9453-07-C-0178" with -- This invention was made with Government support under AFRL Contract # FA9453-07-C-0178 awarded by the U.S. Air Force Research Laboratory. The Government has certain rights in the invention. --

Signed and Sealed this
Twenty-first Day of October, 2014

Michelle K. Lee
*Deputy Director of the United States Patent and Trademark Office*